United States Patent
Nakayama

(10) Patent No.: US 10,553,396 B2
(45) Date of Patent: Feb. 4, 2020

(54) CHARGED PARTICLE BEAM WRITING APPARATUS AND CHARGED PARTICLE BEAM WRITING METHOD

(71) Applicant: NuFlare Technology, Inc., Yokohama-shi (JP)

(72) Inventor: Takahito Nakayama, Chigasaki (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 16/160,210

(22) Filed: Oct. 15, 2018

(65) Prior Publication Data

US 2019/0122859 A1  Apr. 25, 2019

(30) Foreign Application Priority Data

Oct. 20, 2017  (JP) ................... 2017-203667

(51) Int. Cl.
   *H01J 37/317*  (2006.01)
   *G03F 9/00*   (2006.01)
   *H01J 37/304* (2006.01)

(52) U.S. Cl.
   CPC ........ *H01J 37/3174* (2013.01); *G03F 9/7084* (2013.01); *H01J 37/3045* (2013.01); *H01J 2237/103* (2013.01); *H01J 2237/30455* (2013.01); *H01J 2237/31788* (2013.01)

(58) Field of Classification Search
   CPC ........ H01J 37/3174; H01J 2237/30455; G03F 9/7026; G03F 9/7073; G03F 9/7076; G03F 9/7084; G03F 9/7088
   See application file for complete search history.

(56) References Cited

U.S. PATENT DOCUMENTS

| 2008/0049203 A1* | 2/2008 | Mishima ............... G03F 9/7076 355/53 |
| 2013/0037724 A1* | 2/2013 | Tsuruta ............... H01J 37/3045 250/397 |

FOREIGN PATENT DOCUMENTS

| JP | 63-020376 | 4/1988 |
| JP | 05-206017 | 8/1993 |
| JP | 07-094401 | 4/1995 |
| JP | 09-022859 | 1/1997 |
| JP | 2012-094744 | 5/2012 |

* cited by examiner

*Primary Examiner* — Eliza W Osenbaugh-Stewart
(74) *Attorney, Agent, or Firm* — Oblon, McClelland, Maier & Neustadt, L.L.P.

(57) ABSTRACT

In one embodiment, a charged particle beam writing apparatus includes a writer writing a pattern on a substrate on a stage with a charged particle beam, a mark substrate disposed on the stage and having a mark, an irradiation position detector detecting an irradiation position of the charged particle beam on a mark surface, a height detector detecting a surface height of the substrate and the mark substrate, a drift correction unit calculating an amount of drift correction, and a writing control unit correcting the irradiation position of the charged particle beam by using the amount of drift correction. The mark substrate has a pattern region with a plurality of marks and a non-pattern region with no pattern therein, and at least part of the non-pattern region is disposed between different portions of the pattern region. The height detector detects a height of a detection point in the non-pattern region.

15 Claims, 5 Drawing Sheets

FIG. 2
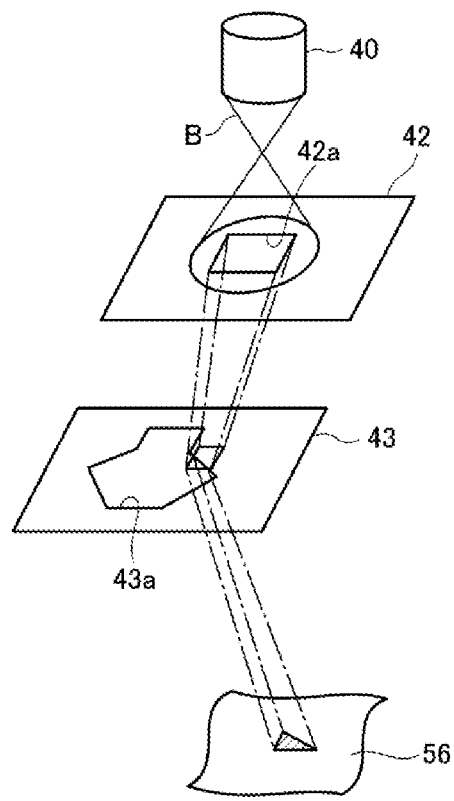
FIG. 3A
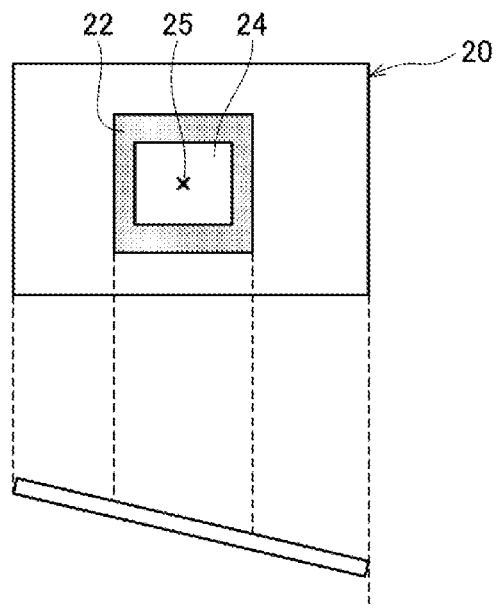
FIG. 3B

FIG. 5A
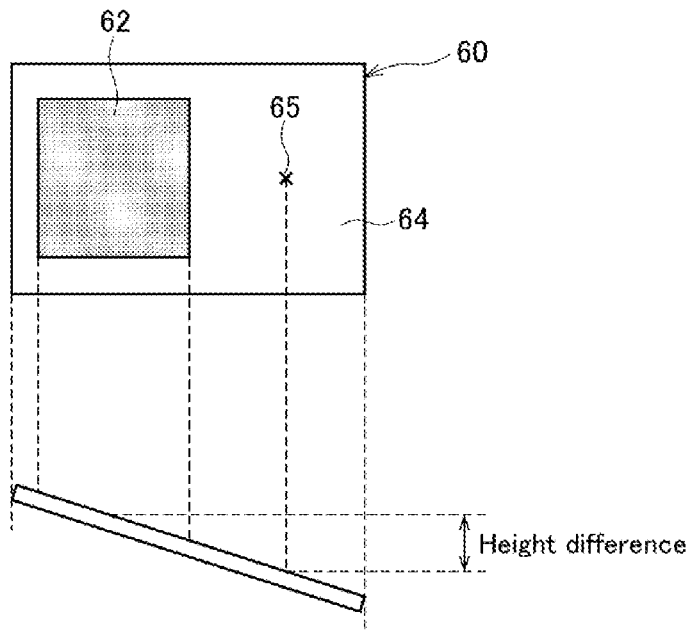
FIG. 5B
FIG. 6
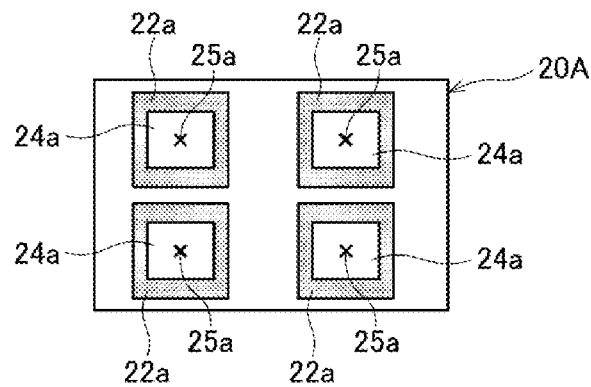
FIG. 7
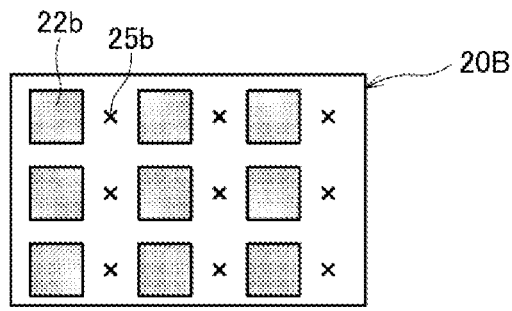

CHARGED PARTICLE BEAM WRITING APPARATUS AND CHARGED PARTICLE BEAM WRITING METHOD

CROSS REFERENCE TO RELATED APPLICATION

This application is based upon and claims benefit of priority from the Japanese Patent Application No. 2017-203667, filed on Oct. 20, 2017, the entire contents of which are incorporated herein by reference.

FIELD

The present invention relates to a charged particle beam writing apparatus and a charged particle beam writing method.

BACKGROUND

As LSI circuits are increasing in density, the line width of circuits of semiconductor devices is becoming finer. To form a desired circuit pattern onto a semiconductor device, a method of reducing and transferring, by using a reduction-projection exposure apparatus, onto a wafer a highly precise original image pattern (mask, or reticle, in particular, when used in a stepper or a scanner) formed on a quartz is employed. The highly precise original image pattern is written by using an electron beam writing apparatus, in which a technology commonly known as electron beam lithography is used.

In the electron beam writing apparatus, a phenomenon called beam drift may occur in which, due to various factors, the irradiation position of the electron beam shifts over time during writing. A drift correction is made to cancel out the beam drift. In the drift correction, a measurement mark on a mark substrate disposed on a stage is scanned with an electron beam, and the irradiation position of the electron beam is measured to determine the amount of drift. The measurement mark is, for example, a metal pattern of dots or crosses.

Generally, each sample (mask), which is a writing target, has a different thickness because of the tolerance. The mark substrate placed on the stage is warped or tilted. The resulting difference between the surface height of the mark substrate and the surface height of the sample causes an error between the amount of drift on the mark surface and the amount of drift on the sample surface. To make a drift correction with high accuracy, it is necessary to consider the difference between the height of the mark surface and the height of the sample surface.

The electron beam writing apparatus includes a detector that irradiates the sample surface and the mark surface with laser light so as to detect the height of the sample surface and the height of the mark surface from the corresponding light receiving position of the reflected light. In the mark substrate, if a pattern region having the measurement mark formed therein is irradiated with laser light, light interference or the like may cause an error in height measurement. Accordingly, the detector irradiates a non-pattern region having no pattern therein with laser light.

However, warpage or tilt of the mark substrate creates a height difference between the pattern region and the non-pattern region. This results in an error between the surface height of the mark substrate detected by the detector and the height of the mark surface where the amount of drift is measured. Therefore, it has been difficult to make a drift correction with high accuracy.

BRIEF DESCRIPTION OF THE DRAWINGS

FIG. 2 illustrates variable shaping of an electron beam.

FIG. 3A is a plan view of a mark substrate according to the embodiment, and FIG. 3B is a side view of the mark substrate.

FIG. 5A is a plan view of a mark substrate according to a comparative example, and FIG. 5B is a side view of the mark substrate.

FIG. 6 is a plan view of a mark substrate according to another embodiment.

FIG. 7 is a plan view of a mark substrate according to another embodiment.

DETAILED DESCRIPTION

In one embodiment, a charged particle beam writing apparatus includes a writer writing a pattern on a substrate by irradiating the substrate with a charged particle beam, the substrate being a writing target placed on a stage, a mark substrate disposed on the stage and having a mark formed thereon, an irradiation position detector detecting an irradiation position of the charged particle beam on a mark surface by irradiating the mark with the charged particle beam, a height detector detecting a surface height of the substrate and a surface height of the mark substrate by emitting laser light and receiving reflected light, a drift correction unit calculating an amount of drift of the charged particle beam on the mark surface based on the irradiation position detected by the irradiation position detector, and calculating an amount of drift correction based on the amount of drift, and a writing control unit correcting the irradiation position of the charged particle beam by using the amount of drift correction. The mark substrate has a pattern region with a plurality of marks formed therein and a non-pattern region with no pattern therein, and at least part of the non-pattern region is disposed between different portions of the pattern region. The height detector detects a height of a detection point in the non-pattern region.

An embodiment of the present invention will be described below with reference to the drawings. In the embodiment, a configuration using an electron beam as an example of a charged particle beam will be described. The charged particle beam is not limited to the electron beam. For example, the charged particle beam may be an ion beam.

Figure 1:
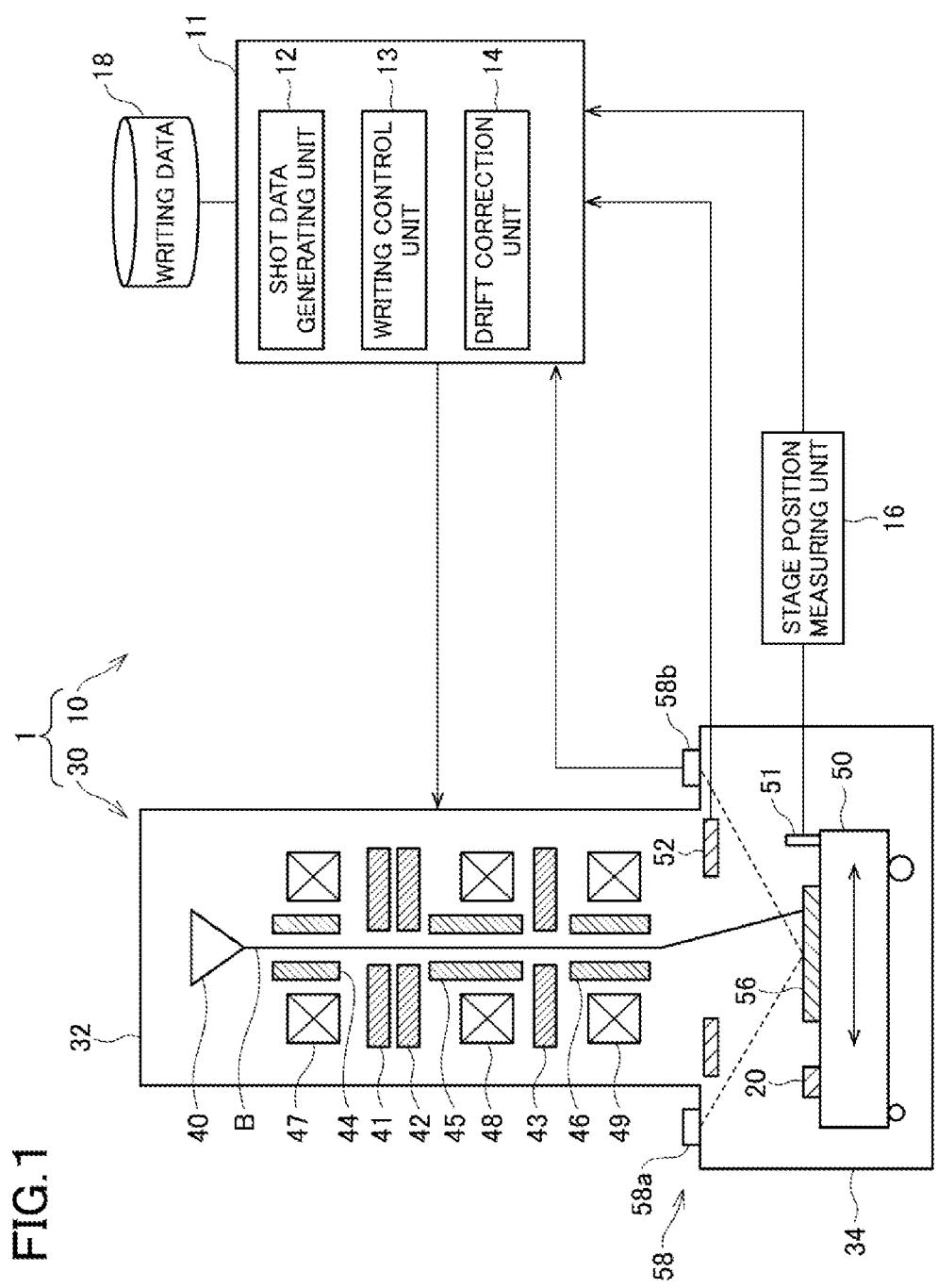
FIG. 1 is a schematic diagram of an electron beam writing apparatus according to an embodiment of the present invention.

FIG. 1 is a schematic diagram of an electron beam writing apparatus according to an embodiment of the present invention. A writing apparatus 1 illustrated in FIG. 1 is a writing apparatus of a variable shaping type that includes a writer 30 and a controller 10. The writer 30 writes a desired pattern on a substrate 56 (writing target) by irradiating it with an electron beam, and the controller 10 controls the operation of the writer 30.

The writer 30 includes a column 32 and a writing chamber 34. The column 32 includes therein an electron gun 40, a blanking aperture member (plate) 41, a first shaping aperture member 42, a second shaping aperture member 43, a blanking deflector 44, a shaping deflector 45, an objective deflector 46, an illuminating lens 47, a projection lens 48, and an objective lens 49.

The writing chamber 34 includes a stage 50 movably disposed therein. The stage 50 is configured to move in the X direction and the Y direction that are orthogonal to each other in a horizontal plane. The substrate 56 is placed on the stage 50. Examples of the substrate 56 include an exposure mask used in manufacturing semiconductor devices, a mask blank, and a semiconductor substrate (silicon wafer) on which semiconductor devices are manufactured. The substrate 56 is placed on a base (Z stage, not shown) disposed on the stage 50 and is adjustable in the height direction.

A mirror 51 for measuring the position of the stage 50 in the horizontal plane is disposed on the stage 50. A mark substrate 20 having a mark formed thereon is also disposed on the stage 50. The mark on the mark substrate 20 is used to measure the amount of drift of an electron beam B. For example, the mark substrate 20 is a silicon substrate, on which a mark of heavy metal, such as tantalum or tungsten, is formed.

An irradiation position detector 52 is disposed above the stage 50. By irradiating the mark with the electron beam B, the irradiation position detector 52 detects the irradiation position (beam position) of the electron beam B. Examples of the irradiation position detector 52 include an electron detector. When the mark is scanned by the electron beam B, the electron detector detects electrons reflected from the mark as a current value. The detected beam position is sent to a control computer 11 (described below).

The outer periphery of the writing chamber 34 is provided with a height detector 58 that detects the surface height of the substrate 56 and the surface height of the mark substrate 20. The height detector 58 includes a light projector 58a that obliquely irradiates the surface of the substrate 56 and the surface of the mark substrate 20 with laser light from above, and a light receiver 58b that receives the reflected light. From the light receiving position at which the light receiver 58b has received the reflected light, the height detector 58 can detect the surface height of either the substrate 56 or the mark substrate 20. The detected surface height is sent to the control computer 11.

The controller 10 includes the control computer 11, a stage position measuring unit 16, and a storage device 18. The control computer 11 includes a shot data generating unit 12, a writing control unit 13, and a drift correction unit 14. Data input to and output from each unit of the control computer 11 and data used during computation are appropriately stored in a memory (not shown).

These units of the control computer 11 may be configured either by hardware or software. When these units are configured by software, programs that implement at least some of their functions may be stored in a recording medium, such as a CD-ROM, and loaded into and executed by a computer including an electric circuit.

The storage device 18 (storage unit) stores writing data therein. The writing data is obtained by converting layout data, which represents the arrangement of designed graphic patterns, into a format in which the data can be input to the writing apparatus 1.

The shot data generating unit 12 reads the writing data from the storage device 18 and performs multiple stages of data conversion to generate shot data specific to the apparatus. The shot data defines, for example, graphic type, graphic size, irradiation position, and irradiation time. On the basis of the shot data, the writing control unit 13 controls the writer 30 to perform a writing process.

The drift correction unit 14 calculates the amount of drift and determines the amount of drift correction for cancelling out the drift. A method for calculating the amount of drift will be described later on. On the basis of the amount of drift correction, the drift correction unit 14 generates correction information for correcting the amount of deflection (beam irradiation position) of the electron beam B and supplies the correction information to the writing control unit 13. The writing control unit 13 controls the writer 30 using the correction information to correct the beam irradiation position.

The stage position measuring unit 16 includes a laser length measuring machine that measures the position of the stage 50 by sending and receiving laser light to and from the mirror 51 secured on the stage 50. The stage position measuring unit 16 notifies the control computer 11 of the measured stage position.

FIG. 1 shows components necessary to explain the embodiment. The writing apparatus 1 may include other components.

When the electron beam B emitted from the electron gun 40 in the column 32 passes through the blanking deflector 44, the blanking deflector 44 deflects the electron beam B in such a manner that the electron beam B is passed through the blanking aperture member 41 in the beam-on state and is entirely blocked by the blanking aperture member 41 in the beam-off state. The electron beam B that is passed through the blanking aperture member 41 after transition from the beam-off state to the beam-on state before being turned off is defined as one electron beam shot.

The electron beam B in each shot generated by passing through the blanking deflector 44 and the blanking aperture member 41 is directed by the illuminating lens 47 onto the first shaping aperture member 42 having a rectangular opening 42a (see FIG. 2). By passing through the opening 42a in the first shaping aperture member 42, the electron beam B is formed into a rectangular shape.

The electron beam passing through the first shaping aperture member 42 to form a first shaping aperture image is projected by the projection lens 48 onto the second shaping aperture member 43. The position of the first shaping aperture image on the second shaping aperture member 43 is controlled by the shaping deflector 45. This varies the shape and dimensions (i.e., enables variable shaping) of the electron beam passing through an opening 43a in the second shaping aperture member 43.

The electron beam passed through the second shaping aperture member 43 is brought into focus by the objective lens 49, deflected by the objective deflector 46, and applied to a desired point of the substrate 56 on the XY stage 50.

FIG. 3A is a plan view of the mark substrate 20. The mark substrate 20 has a pattern region 22 with a plurality of marks formed therein, and a non-pattern region 24 with no pattern therein. The pattern region 22 includes many marks with patterns of crosses or dots formed therein. When marks are degraded by being scanned by the electron beam B, unused marks are sequentially used.

In the example illustrated in FIG. 3A, the pattern region 22 has an open square shape and the non-pattern region 24 is located inside the pattern region 22. In other words, the pattern region 22 surrounds the non-pattern region 24. The non-pattern region 24 may be, for example, a square region about 1 mm on a side, but is not limited to this particular size. The center of the non-pattern region 24 (indicated by a cross in the drawing) corresponds to a height detection point 25 which is irradiated by laser light from a light projector 58a of the height detector 58.

By defining the position described above as the height detection point 25, even if the mark substrate 20 is warped or tilted as illustrated in FIG. 3B, the height of the height detection point 25 can be made substantially the same as the mark height in the pattern region 22.

Figure 4:
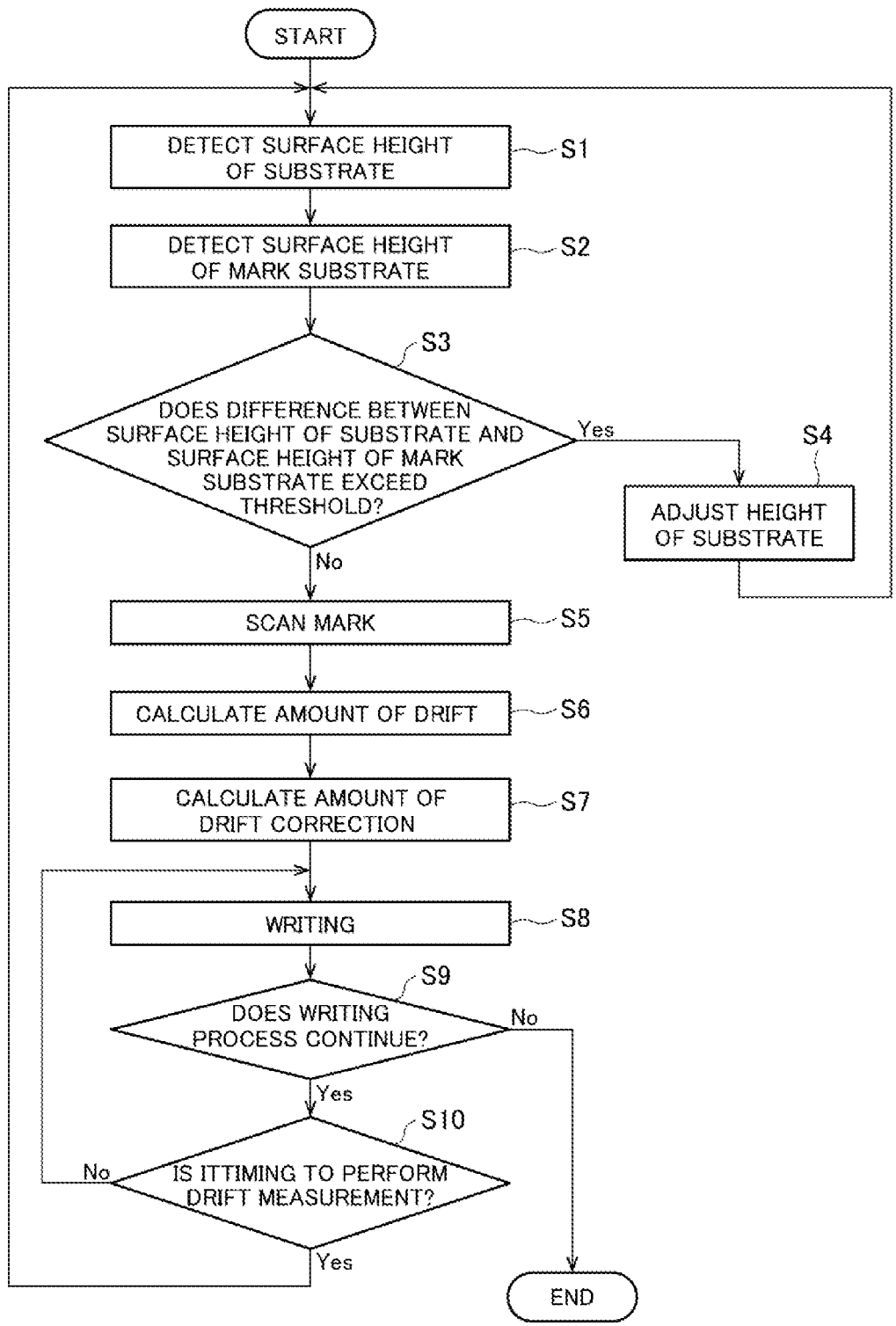
FIG. 4 is a flowchart illustrating a writing method according to the embodiment.

A writing method including a drift correction process which involves using the mark substrate 20 will now be described with reference to the flowchart of FIG. 4.

First, the height detector 58 detects the surface height of the substrate 56 (step S1). Next, the height detector 58 irradiates the height detection point 25 of the mark substrate 20 with laser light to detect the surface height of the mark substrate 20 (step S2). Then, a determination is made as to whether the difference between the surface height of the substrate 56 and the surface height of the mark substrate 20 exceeds a threshold (step S3). If the difference exceeds the threshold, the height of the substrate 56 is adjusted (step S4).

The stage 50 is moved to adjust a mark to the center position of the objective lens 49. The mark is then scanned by the electron beam B (step S5). The irradiation position detector 52 detects the reflected electrons, measures the beam profile, and detects the beam irradiation position. By the drift correction unit 14, the amount of deviation between the detected beam irradiation position and a reference position is calculated as the amount of drift (step S6).

On the basis of the amount of drift measured, the drift correction unit 14 calculates the amount of drift correction (step S7). On the basis of writing data read from the storage device 18 and the amount of drift correction calculated, the writing control unit 13 performs a writing process while correcting the beam irradiation position (step S8).

Until the next measurement of the amount of drift (YES in step S9, NO in step S10), the writing process using the amount of drift correction calculated in step S7 continues to be performed.

Comparative Example

FIG. 5A is a plan view of a mark substrate 60 according to a comparative example, and FIG. 5B is a side view of the mark substrate 60. The mark substrate 60 has a pattern region 62 with a plurality of marks formed therein, and a non-pattern region 64 with no pattern therein. The pattern region 62 is located on one side of the mark substrate 60 divided into two halves, and the non-pattern region 64 is located on the other side of the mark substrate 60. In the non-pattern region 64, a height detection point 65 is located at a distance from the pattern region 62.

If the mark substrate 60 is tilted as illustrated in FIG. 5B, an error develops between the height of the height detection point 65 and the mark height in the pattern region 62. This means that from the difference between the height of the height detection point 65 and the surface height of the substrate 56 and the amount of drift on the mark surface, the amount of drift on the surface of the substrate 56 cannot be accurately calculated and this results in insufficient drift correction.

In the present embodiment, on the other hand, even when the mark substrate 20 is tilted or warped, the mark height can be accurately detected since the marks in the pattern region 22 and the height detection point 25 are located at substantially the same height. This enables accurate calculation of the amount of drift on the surface of the substrate 56 and improves accuracy in pattern writing.

The embodiment described above is an example where the pattern region 22 has an open square shape (square ring shape). The pattern region 22 may have a circular ring shape, or may be in the shape of an incomplete ring, such as a C shape or square U shape.

As in a mark substrate 20A illustrated in FIG. 6, there may be provided a plurality of pattern regions 22a of an open square shape, each surrounding a non-pattern region 24a including a height detection point 25a. The pattern regions 22a each include a plurality of marks. For measuring the amount of drift, the height of the height detection point 25a that corresponds to the pattern region 22a including a mark to be beam-scanned is detected.

As in a mark substrate 20B illustrated in FIG. 7, there may be provided a plurality of combinations, each including a substantially rectangular pattern region 22b and a height detection point 25b corresponding thereto.

Figure 8:
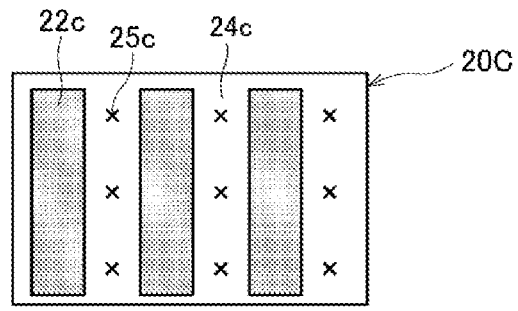
FIG. 8 is a plan view of a mark substrate according to another embodiment.

As in a mark substrate 20C illustrated in FIG. 8, a plurality of elongated rectangular pattern regions 22c may be arranged to be spaced apart. In this case, a region between adjacent ones of the pattern regions 22c (or a region adjacent to each pattern region 22c) is defined as a non-pattern region 24c, in which a plurality of height detection points 25c are set. For measuring the amount of drift, the height of the height detection point 25c closest to a mark to be beam-scanned is detected.

Figure 9:
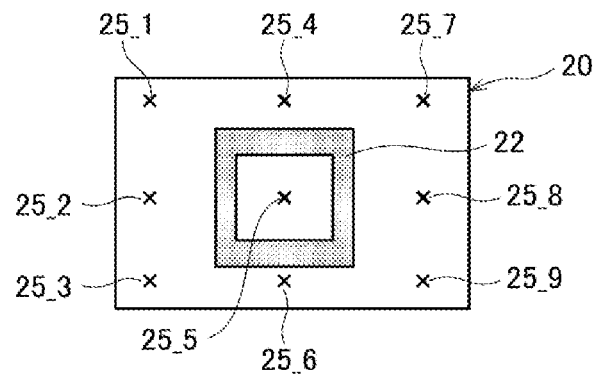
FIG. 9 is a plan view of a mark substrate according to another embodiment.

Although the mark substrate 20 has only one height detection point 25 in the embodiment described above, the heights of a plurality of points may be detected and interpolated to determine the mark height. For example, as illustrated in FIG. 9, a plurality of height detection points 25_1 to 25_9 are set in the non-pattern regions outside and inside the pattern region, and the heights of the height detection points 25_1 to 25_9 are detected and interpolated to determine the mark height.

Figure 10:
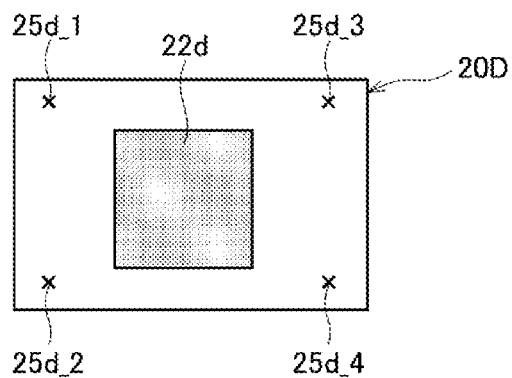
FIG. 10 is a plan view of a mark substrate according to another embodiment.

As illustrated in FIG. 10, a mark substrate 20D with a substantially rectangular pattern region 22d in the center thereof may have a plurality of height detection points in a non-pattern region surrounding the pattern region 22d. For example, height detection points 25d_1 to 25d_4 are set at the four corners of the mark substrate 20D. Then, detected heights are interpolated to determine the mark height.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:
1. A charged particle beam writing apparatus comprising:
   a writer writing a pattern on a substrate by irradiating the substrate with a charged particle beam, the substrate being a writing target placed on a stage;
   a mark substrate disposed on the stage and having a mark formed thereon;
   an irradiation position detector detecting an irradiation position of the charged particle beam on a mark surface by irradiating the mark with the charged particle beam;

a height detector detecting a surface height of the substrate and a surface height of the mark substrate by emitting laser light and receiving reflected light;

a drift correction unit calculating an amount of drift of the charged particle beam on the mark surface based on the irradiation position detected by the irradiation position detector, and calculating an amount of drift correction based on the amount of drift; and a writing control unit correcting the irradiation position of the charged particle beam by using the amount of drift correction, wherein the mark substrate has a pattern region with a plurality of marks formed therein and a non-pattern region with no pattern therein, and at least part of the non-pattern region is disposed between different portions of the pattern region; and the height detector detects a height of a detection point in the non-pattern region.

2. The apparatus according to claim 1, wherein the height detector detects the height of the detection point in the non-pattern region as the surface height of the mark substrate, and the apparatus adjusts a height of the substrate in such a manner that a difference between the surface height of the substrate and the surface height of the mark substrate does not exceed a predetermined value.

3. The apparatus according to claim 2, wherein the pattern region is square ring-shaped, circular ring-shaped, or C-shaped, and the non-pattern region including the detection point is disposed inside the pattern region.

4. The apparatus according to claim 3, wherein the detection point is located at a center of the non-pattern region.

5. The apparatus according to claim 3, wherein the mark substrate has a plurality of pattern regions, each having the non-pattern region therein.

6. The apparatus according to claim 1, wherein the height detector detects heights of a plurality of detection points in the non-pattern region, and the apparatus adjusts a height of the substrate in such a manner that a difference between the surface height of the substrate and the surface height of the mark substrate based on the heights of the plurality of detection points does not exceed a predetermined value.

7. The apparatus according to claim 6, wherein the pattern region is square ring-shaped, circular ring-shaped, or C-shaped, and the non-pattern region including at least one detection point is disposed inside and outside the pattern region.

8. The apparatus according to claim 7, wherein the non-pattern region outside the pattern region includes a plurality of detection points.

9. A charged particle beam writing method for performing writing by using a charged particle beam writing apparatus that includes a writer configured to write a pattern on a substrate by irradiating the substrate with a charged particle beam, the substrate being a writing target placed on a stage, and a mark substrate disposed on the stage and having a mark formed thereon, the charged particle beam writing method comprising:

detecting a surface height of the substrate and a surface height of the mark substrate by emitting laser light and receiving reflected light;

detecting an irradiation position of the charged particle beam on a mark surface by irradiating the mark with the charged particle beam;

calculating an amount of drift of the charged particle beam on the mark surface based on the detected irradiation position;

calculating an amount of drift correction based on the amount of drift; and correcting the irradiation position of the charged particle beam based on the amount of drift correction, wherein the mark substrate has a pattern region with a plurality of marks formed therein and a non-pattern region with no pattern therein, at least part of the non-pattern region is disposed between different portions of the pattern region, and a height of a detection point in the non-pattern region is detected.

10. The method according to claim 9, wherein the height of the detection point in the non-pattern region is detected as the surface height of the mark substrate; and a height of the substrate is adjusted in such a manner that a difference between the surface height of the substrate and the surface height of the mark substrate does not exceed a predetermined value.

11. The method according to claim 10, wherein the pattern region is square ring-shaped, circular ring-shaped, or C-shaped, and the non-pattern region including the detection point is disposed inside the pattern region.

12. The method according to claim 11, wherein the detection point is located at a center of the non-pattern region.

13. The method according to claim 9, wherein heights of a plurality of detection points in the non-pattern region are detected; and a height of the substrate is adjusted in such a manner that a difference between the surface height of the substrate and the surface height of the mark substrate based on the heights of the plurality of detection points does not exceed a predetermined value.

14. The method according to claim 13, wherein the pattern region is square ring-shaped, circular ring-shaped, or C-shaped, and the non-pattern region including at least one detection point is disposed inside and outside the pattern region.

15. The method according to claim 14, wherein the non-pattern region outside the pattern region includes a plurality of detection points.

* * * * *